United States Patent [19]

Biernath

[11] Patent Number: 5,345,364

[45] Date of Patent: Sep. 6, 1994

[54] EDGE-CONNECTING PRINTED CIRCUIT BOARD

[75] Inventor: Rolf W. Biernath, Roseville, Minn.

[73] Assignee: Minnesota Mining and Manufacturing Company, St. Paul, Minn.

[21] Appl. No.: 109,213

[22] Filed: Aug. 18, 1993

[51] Int. Cl.$^5$ .............................................. H05K 1/00
[52] U.S. Cl. ..................... 361/749; 439/59; 439/65; 439/67; 439/77; 174/254; 361/751
[58] Field of Search ............. 439/65, 66, 67, 47, 439/48, 59, 60, 77; 174/254; 361/749, 750, 751, 789

[56] References Cited

U.S. PATENT DOCUMENTS

| | | |
|---|---|---|
| 2,932,810 | 4/1960 | Novak . |
| 2,961,629 | 11/1960 | Kamm . |
| 3,114,587 | 12/1963 | Herrmann . |
| 3,806,767 | 4/1974 | Lehrfeld ............... 361/749 |
| 3,924,915 | 12/1975 | Conrad . |
| 4,029,374 | 6/1977 | Nestor et al. . |
| 4,116,516 | 9/1978 | Griffin . |
| 4,495,546 | 1/1985 | Nakamura et al. ................ 361/749 |
| 4,575,166 | 3/1986 | Kasdagly et al. . |
| 4,581,495 | 4/1986 | Geri et al. . |
| 4,645,732 | 2/1987 | Young . |
| 4,693,529 | 9/1987 | Stillie . |
| 4,695,258 | 9/1987 | Hanson et al. . |
| 4,717,345 | 1/1988 | Gordon et al. . |
| 4,740,867 | 4/1988 | Roberts et al. . |
| 4,784,615 | 11/1988 | Teng-Hong . |
| 4,798,541 | 1/1989 | Porter . |
| 4,815,979 | 3/1989 | Porter . |
| 4,897,054 | 1/1990 | Gilissen et al. . |
| 4,971,565 | 11/1990 | Fox, Jr. . |
| 4,971,575 | 11/1990 | Martellotti . |
| 4,993,958 | 2/1991 | Trobough et al. . |
| 5,002,496 | 3/1991 | Fox, Jr. . |
| 5,005,105 | 4/1991 | Onodera ............................. 361/749 |
| 5,009,607 | 4/1991 | Gordon et al. . |
| 5,044,980 | 9/1991 | Krumme et al. . |
| 5,092,782 | 3/1992 | Beaman . |
| 5,133,667 | 7/1992 | Daughtrey . |
| 5,141,444 | 8/1992 | Redmond et al. . |
| 5,153,818 | 10/1992 | Mukougawa et al. . |

FOREIGN PATENT DOCUMENTS

| | | |
|---|---|---|
| 56-59774 | of 1981 | Japan . |
| 58-96686 | 6/1983 | Japan . |
| 60-92866 | 6/1985 | Japan . |
| 2-29670 | 9/1985 | Japan . |
| 1472688 | 5/1977 | United Kingdom . |

Primary Examiner—Leo P. Picard
Assistant Examiner—Bot Ledynh
Attorney, Agent, or Firm—Gary L. Griswold; Walter N. Kirn; Eric D. Levinson

[57] ABSTRACT

A printed circuit board capable of resilient deformation having two major surfaces and a contact edge. Electrically conductive traces are provided on each major surface of the board which lead to electrically conductive contact pads at the contact edge of the board. A gap is provided between the two major surfaces of the board along the contact edge. The gap permits resilient deformation of the board so that a force is created upon deformation which will bias the major surfaces toward their undeformed position. An elastomeric biasing member may be provided in the gap.

12 Claims, 2 Drawing Sheets

EDGE-CONNECTING PRINTED CIRCUIT BOARD

FIELD OF THE INVENTION

The present invention relates generally to printed circuit boards and more particularly to connecting printed circuit boards to other electronic devices.

BACKGROUND OF THE INVENTION

Printed circuit boards are typically used to increase the performance capability and memory capacity of computers. Printed circuit boards are usually comprised of a rigid substrate having one or more integrated circuits and/or other electronic circuitry provided thereon. It is well known that a printed circuit board can be electrically connected to an electronic device, such as another printed circuit board, by providing one board with several pins and the other with sockets for receiving those pins. Stamped metal springs are typically used to ensure that good electrical contact is maintained between the pins and the sockets. Usually, one spring is provided for each pin.

The use of these stamped metal springs, however, becomes increasingly costly as the number of pins increases. The number of pins, and therefore the number of springs required, typically ranges between a few and 68, but may extend into the hundreds. Thus, while it may be advantageous to decrease the size of the pins or the spacing between them, this reduction can be complicated by the difficulty and cost of manufacturing and installing so many tiny springs, each of which must still be strong enough to ensure good electrical contact between the pins and their respective sockets.

Printed circuit boards can be used in integrated circuit (IC) cards, which are increasingly being used with portable computers. Integrated circuit cards include personal computer (PC) cards and Smart cards. There are two basic types of PC cards: input/output (IO) cards and memory cards. Memory cards are used to store data in portable electronic devices, such as portable computers. Memory cards can be used to increase the main memory of a computer, or they can be used to store information pertaining to one particular subject, e.g., they can be used in a hospital setting to store a patient's medical records. Memory cards typically include at least one integrated circuit (IC) chip having either read-only-memory (ROM) or random-access-memory (RAM). The chief advantage of such cards is that they can be easily inserted and removed from the electronic device by the use of a multi-pin connector of the type described above.

In order to be useful, the card connector must be able to withstand many insertion and withdrawal cycles. Performance requirements established by certain standards organizations may typically be 10,000 insertion and withdrawal cycles. It would be desirable to have a printed circuit board connector which met these requirements and yet had a simple and reliable design.

SUMMARY OF THE INVENTION

The present invention includes a printed circuit board capable of resilient deformation having two major surfaces and a contact edge. Electrically conductive traces on at least one of the major surfaces lead to electrically conductive contact pads at the contact edge of the board. A gap in the board is formed between the two major surfaces along the contact edge. The gap permits resilient deformation of the board so that a force is created upon deformation which will bias the major surfaces toward their undeformed position. A biasing member such as an elastomer can also be provided within the gap to further bias the major surfaces.

In one embodiment of the present invention, electrically conductive traces and contact pads are provided on both major surfaces of the board. The force created upon deformation biases the two arrays of contact pads away from each other. The board can be connected to another electronic device by pressing the board between two rows of header pins, which are electrically connected to the other device, so that the contact pads on the board make an electrical connection with the header pins. In another embodiment of the present invention, the printed circuit board includes a pin guide assembly, wherein the contact edge is disposed within the assembly, and wherein the assembly is configured to guide conductive pins from another electronic device into electrical contact with the contact pads.

DETAILED DESCRIPTION

Figure 1:
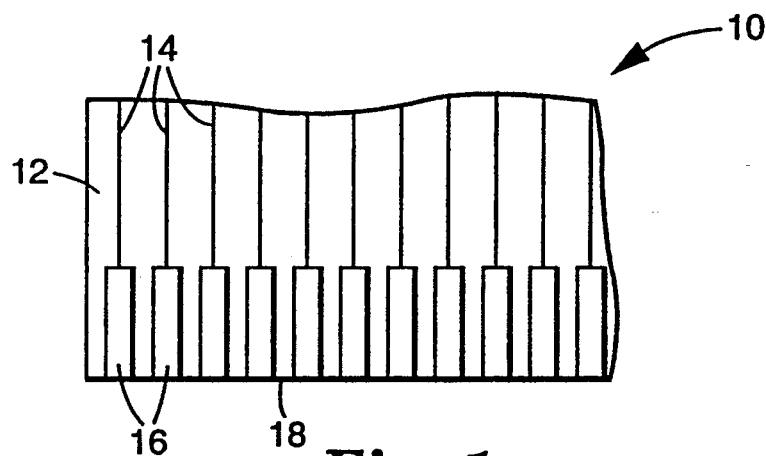
FIG. 1 is a schematic top view of a portion of a printed circuit board according to the present invention.

A printed circuit board 10 according to the present invention is shown in FIG. 1. Printed circuit board 10 is comprised of board 12 having a first plurality of electrically conductive traces 14 which leads to a first plurality of electrically conductive contact pads 16, which is positioned along contact edge 18 of one of the major surfaces of board 12. A second plurality of electrically conductive traces 24 leading to a second plurality of electrically conductive contact pads 26, also positioned along contact edge 18, is optionally provided on the other major surface of printed circuit board 10. Printed circuit board 10 can include one or more IC chips (not shown) mounted thereon, and can be included in an IC card (also not shown).

Figure 2A:
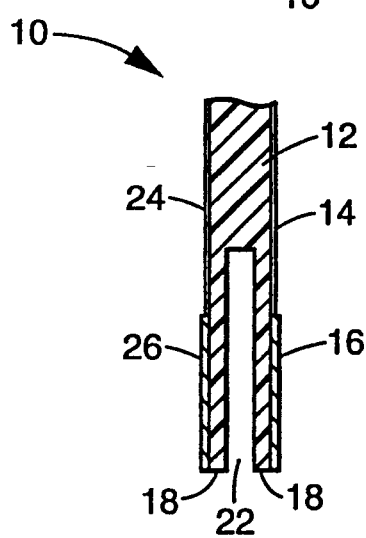
FIGS. 2A, 2B, and 3 are schematic cross-sectional side views of alternative embodiments of the board of FIG. 1.
Figure 2B:
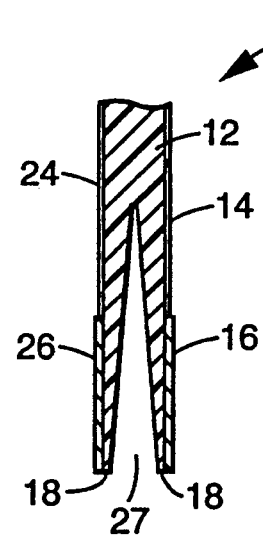

A schematic cross-sectional side view of circuit board 10 is shown in FIGS. 2A and 2B. In FIG. 2A, board 12 has an air gap 22 between its major surfaces which extends along contact edge 18 of the board. Gap 22 preferably has a depth somewhat greater than the length of contact pads 16 and 26 so that the two pluralities of contact pads are separated by the gap. Gap 22 has an opening having a rectangular cross-section which is relatively constant throughout its depth into board 12, so that the thickness of the board on each side of the gap is relatively constant.

An alternative construction of the gap is shown in FIG. 2B. Air gap 27 is tapered so that the rectangular cross-sectional area of the opening of the gap gradually decreases for cross-sections taken further from contact edge 18, so that the thickness of board 12 on each side of the gap gradually increases further from the contact edge. Those skilled in the art will appreciate that other gap sizes and shapes are possible, and that these various shapes will influence the resiliency and strength of those portions of board 12 supporting contact pads 16 and 26.

Figure 3:
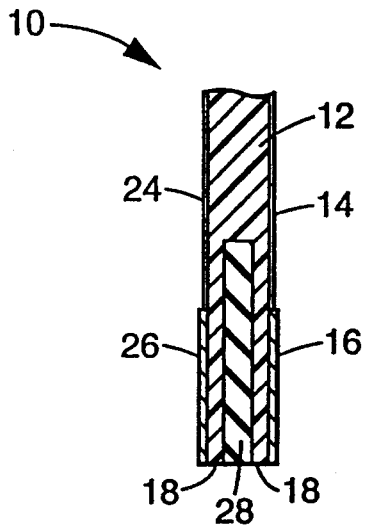

In one embodiment, the gap may be filled with a biasing member 28, as shown in FIG. 3. Biasing member 28 could also be used to fill gap 27 in board 12 in FIG. 2B. It may also be desirable to epoxy the two major surfaces of board 12 together at contact edge 18 to facilitate insertion of the board into an electrical connector socket (discussed below).

Figure 4:
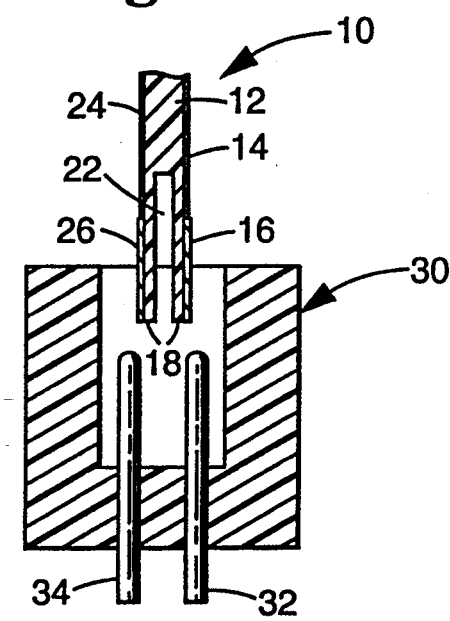
FIG. 4 is a schematic cross-sectional side view of the board of FIG. 1 being inserted into an electrical connector socket.

Board 10 can be electrically connected to another electronic device, such as another printed circuit board or other electronic circuitry, as follows. An electronic device (not shown) has an electrical connector socket 30, as shown in FIG. 4. Socket 30 has a first row of header pins 32 and a second row of header pins 34. The two rows of header pins 32 and 34 correspond to the two pluralities of contact pads 16 and 26. As board 10 is inserted between header pins 32 and 34, contact edge 18 is compressed, thereby decreasing the width of gap 22, and thereby decreasing the distance between the two pluralities of contact pads 16 and 26. Board 12 resists this compression by virtue of its inherent resiliency. This provides a snug fit between board 12 and socket 30, thus ensuring a good electrical connection between contact pads 16 and 26 and pins 32 and 34, respectively. If board 10 includes biasing member 28 in the gap, the biasing member will also contribute to resisting the deformation of board 12 at contact edge 18, thereby biasing the two major surfaces of the board away from each other.

Figure 5:
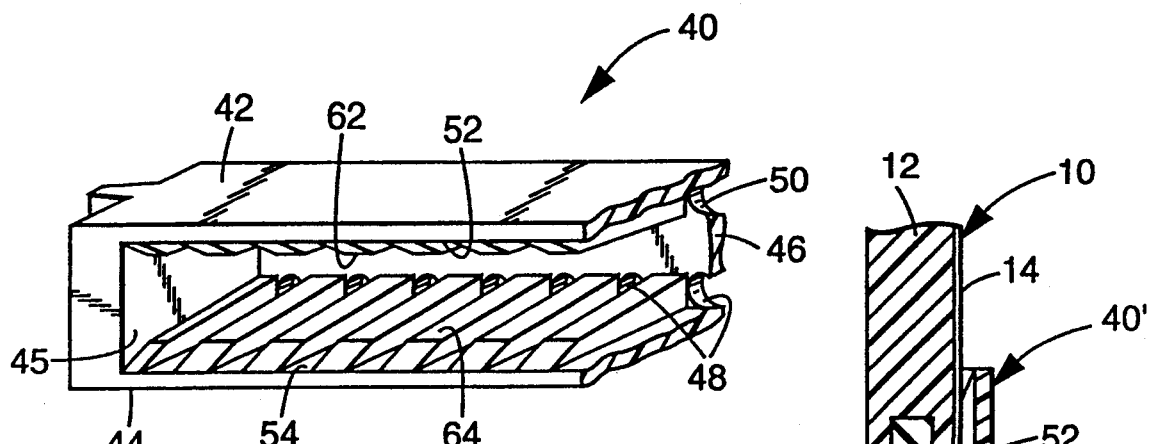
FIG. 5 is a perspective view of a pin guide assembly for use in one embodiment of the present invention.

In order to ensure proper registration between contact pads 16 and 26 and header pins 32 and 34, respectively, it may be desirable to use a pin guide assembly 40 in conjunction with board 10. As shown in FIG. 5, assembly 40 has two substantially parallel side walls 42 and 44. Side walls 42 and 44 are connected by two substantially parallel shorter walls 45 which should be longer than the thickness of board 12. Side walls 42 and 44 are also connected by a front wall 46. Front wall 46 has a row of through holes 48 adjacent to side wall 44 and extending along the length of side wall 44. Front wall 46 has a second row of through holes 50 adjacent to opposite side wall 42 and extending along the length of side wall 46.

Assembly 40 is provided with two sets of parallel ridges 62 and 64 which define channels 52 and 54, respectively. The first set of ridges 62 and channels 52 is provided in the surface of wall 42 facing wall 44. Channels 52 are spaced across the length of wall 42. Each channel 52 runs from a hole 50 to the opening of assembly 40 opposite front wall 46. Similarly, the second set of ridges 64 and channels 54 is provided in the surface of wall 44 facing wall 42. Channels 54 are spaced across the length of wall 44, and each channel 54 runs from a hole 48 to the opening of assembly 40 opposite front wall 46. The height of ridges 62 and 64 gradually decreases from front wall 46 to the opening of assembly 40 opposite the front wall, as shown in FIG. 5. In the alternative, the rate of tapering of the height of ridges 62 and 64 may be greater near front wall 46 than near the opening of assembly 40.

Figure 6:
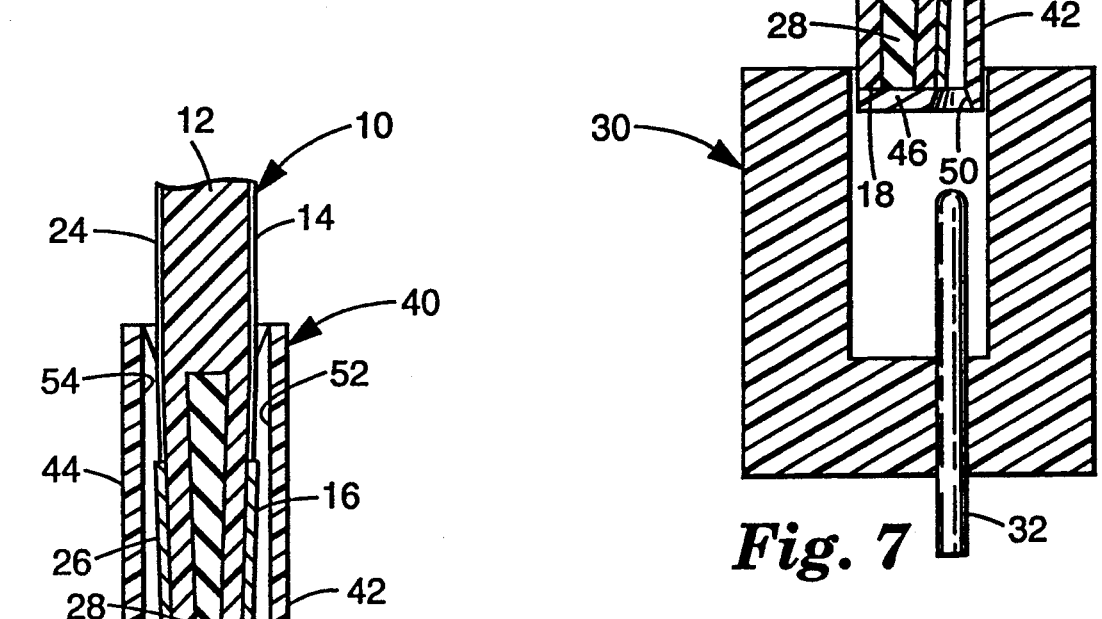
FIG. 6 is a schematic cross-sectional side view of the board of FIG. 1 having a pin guide assembly being inserted into an electrical connector socket.

Board 10 is inserted into assembly 40 so that contact edge 18 of the board contacts front wall 46 of the assembly, as shown in FIG. 6. Board 10 should be oriented in the assembly 40 such that contact pads 16 and 26 are aligned with channels 52 and 54, respectively. Board 10 can be secured to assembly 40 by conventional means, such as a compression fit or an adhesive. Board 10 is preferably detachably secured to assembly 40 so that the assembly may be temporarily removed to allow contact pads 16 and 26 to be cleaned.

In order to electrically connect board 10 to header 30, the two rows of header pins 32 and 34 must be inserted through the two rows of holes 50 and 48, respectively, in assembly 40. As header pins 32 and 34 travel down channels 52 and 54, respectively, they are forced into contact with contact pads 16 and 26, respectively. Biasing member 28 responds by biasing the two pluralities of contact pads 16 and 26 away from each other, thereby ensuring good electrical contact between the contact pads and header pins 32 and 34.

Assembly 40 helps to ensure that the outer major surfaces of board 10 are protected from gouging by header pins 32 and 34. Ridges 62 and 64 are tapered toward front wall 46 so that pins 32 and 34 experience an increasing amount of interference with contact pads 16 and 26, respectively, during insertion of the pins into assembly 40. Assembly 40 can also provide mechanical support for pins 32 and 34, and thereby serve to prevent the pins from splaying outward during or after insertion. Assembly 40 can be molded using polyphenylene sulfide, polyetherimide, or other engineering thermoplastics or thermosets.

Figure 7:
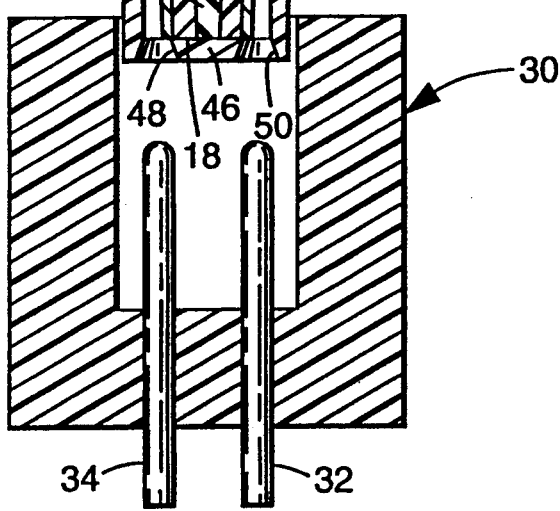
FIG. 7 is a schematic cross-sectional side view of a printed circuit board having a pin guide assembly being inserted into an electrical connector socket according to an alternative embodiment of the present invention.

In an alternative embodiment of the present invention, board 10 has only one plurality of conductive traces 14 leading to one plurality of contact pads 16, as shown in FIG. 7. In this embodiment, an assembly 40' has only a single row of holes 50 leading to channels 52, and header 30 has only a single row of header pins 32. Pins 32 are inserted through holes 50 and down channels 52. Contact pads 16 are biased toward header pins 32 by biasing member 28.

Figure 8:
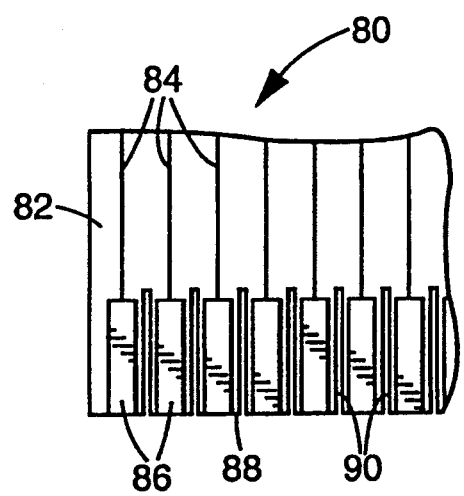
FIG. 8 is a schematic top view of a printed circuit board according to an alternative embodiment of the present invention.

An alternative construction of circuit board 10 is shown as circuit board 80 in FIG. 8. Circuit board 80 is comprised of board 82 and a plurality of electrically conductive traces 84 leading to a plurality of electrically conductive contact pads 86 extending along edge 88 of the board. Each contact pad 86 is separated from adjacent contact pads by slots 90 which allow each contact pad to be individually biased toward a header pin. Slots 90 can be made using a mechanical punch, and can be about 0.35 mm wide by 4.6 mm long. In the alternative, each contact pad 86 can be separated by a slot 90 which terminates before edge 88 of board 80, e.g., about 0.5 mm from the edge.

It may not be desirable to place slots 90 between each and every contact pad 86. Slots 90 might preferably be provided only between adjacent contact pads 86 which might be expected to mate with header pins of different lengths or diameters.

Board 12 is preferably made of a material that is electrically insulative, resistant to fracture, and resilient while still being stiff enough to provide the required bias. Preferred materials for board 12 include glass epoxy laminates, polyimide, or other circuit board laminate materials. Board 12 can also be comprised of multiple layers.

It may also be desirable to provide conductive vias for electrically connecting the two outer major surfaces of board 12. It may also be desirable to provide a conducting plane within the board which could be electrically connected to the outer majors surfaces by the vias. Those skilled in the art will appreciate that more than one contact edge 18 may be provided, and that the contact edge could be provided at various places on board 12.

Preferred materials for biasing member 28 include elastomers, foams, sponges, rubbers, metal springs, plastic or metal mesh, such as steel wool, and liquid or gas-filled elastomeric or non-elastomeric bladders. Materials which are easily deflected under pressure and which exhibit good elastic rebound when the pressure is removed are preferred.

It is preferable that biasing member 28 adhere to the gap in board 12. A thin layer of appropriate adhesive, such as an acrylate or silicon-based adhesive, can be used if needed to secure biasing member 28 to board 12. It may be desirable to be able to combine the adhesive and biasing member 28 into a single material, i.e., an elastomeric adhesive.

The appropriate thickness of biasing member 28 should be chosen to ensure that there will be an interference fit between contact pads 16 and 26 and header pins 32 and 34, respectively. For example, for a board having a total laminate thickness of 0.2 mm being inserted between two rows of header pins that are separated by 1.3 mm, the thickness of biasing member 28 is preferably within the range of from about 1.1 mm to 8 mm, more preferably about 1.3 to 1.6 mm, and most preferably about 1.5 mm.

For example, header pins having a 0.43 mm diameter spaced at 1.27 mm centers would have a gap between their inside faces of 0.84 mm. The sandwich of contact pads, board, and gap 22 (or biasing member 28, if the gap is so filled) must be thicker than the gap between the header pin faces in order to generate an interference fit and the consequent normal forces for making electrical contact. The normal force at the contact can be increased by increasing the interference between the sandwich and the header pins, by increasing the elastic modulus of the biasing member, or by increasing the stiffness of the board material. The contact forces are preferably within the range of from about 0.1 g to 500 g per contact, pad, more preferably from 10 to 150 g per contact pad, and most preferably about 85 g per contact pad, The necessary contact normal forces will depend on the choice of metal platings for the contact pads and pins.

The use of the edge-connecting printed circuit board of the present invention is particularly advantageous where the spacing between adjacent header pins 32 and 34 is so small that the use of so many conventional stamped metal springs in such a small area is problematic. This can occur when adjacent header pins have a center to center spacing of less than about 4 mm.

As header pins 32 and 34 travel down channels 52 and 54, respectively, during insertion of header 30 into assembly 40, the force required to move the header with respect to the assembly increases so that the header pins will remain in electrical contact with contact pads 16 and 26 after insertion. The "feel" of the insertion can be varied by varying the thickness and length of contact pads 16 and 26, by altering the dimensions, location, and modulus of elasticity of biasing member 28, or by changing the shape of ridges 62 and 64. In addition, the thickness of board 10 can be tapered toward contact edge 18 and holes 48 and 50 can be shaped to facilitate insertion of board 10 into header 30. Those skilled in the art will appreciate that the edge-connecting printed circuit board of the present invention can also be used to electrically connect the contact pads on the board to the contact pads of another device, such as a printed circuit board or liquid crystal display.

The present invention will now be further described with reference to the following non-limiting examples. All measurements are approximate.

EXAMPLE 1

A printed circuit board having an air gap according to the present invention was constructed as follows. A 25 $\mu$m thick, 2.5 cm wide strip of Tedlar ™ polyvinyl fluoride (PVF) release liner from E. I. DuPont de Nemours and Co., Inc., Wilmington, Del. was placed between the contact edges of two 89 $\mu$m thick Norplex ™ 106 glass epoxy prepreg from Norplex Oak, a Division of Allied Signal, LaCrosse, Wis. A standard one ounce copper foil was provided on one side of each epoxy prepreg. The non-foil surfaces of the epoxy prepregs were then laminated together in a vacuum press. The remainder of the circuit board construction followed conventional guidelines.

The contact edge of the board was then trimmed so that the release liner was 1.3 cm wide. The release liner was then removed by gently bending the contact edge of the board, thereby creating the air gap.

A 1.1 mm thick, 1.3 cm wide strip of Poron urethane sponge rubber from Rogers Corporation, East Woodstock, Conn., catalog no. 4701-59-25045-1648, was inserted into the air gap. The covercoat metallurgy used to form the conductive traces and contact pads was 70 $\mu$inch (2 $\mu$m) nickel, 3 $\mu$inch (76 nm) palladium, 30 $\mu$inch (0.8 $\mu$m) palladium-nickel from AT&T, and 3 $\mu$inch (76 nm) gold. The strip was then trimmed to match the outline of the board. The board was then inserted in a pin guide assembly and clamped into place.

The board and pin guide assembly were then connected to a 68 header pin connector from AMP Inc., Harrisburg, Pa., part no. 175651-2. The initial electrical resistance of the 68 contacts was measured to be 0.0117 ohms on average with a standard deviation of 0.0020 ohm. After hand insertion following 10,000 insertion and withdrawal cycles, the electrical resistance of the 68 pins was measured to be 0.0133 ohms with a standard deviation of 0.0023 ohm. These data meet the Personal Computer Memory Card International Association (PCMCIA) 2.0 standard for electrical resistance.

EXAMPLE 2

A printed circuit board resembling board 10 of FIG. 3 having a biasing member 28 was constructed as follows. A 0.25 mm thick glass epoxy prepreg layer was placed adjacent a 1.6 mm thick, 2.5 cm wide strip of COHRlastic R10480 elastomer from Furon Company, CHR Division, New Haven, Conn. The thickness of the glass epoxy layer was chosen to match the thickness of the elastomer in its compressed state. The thick glass epoxy layer and adjacent elastomer were then laminated between the 89 $\mu$m glass epoxy prepreg and 1 ounce copper foil layers described in Example 1. The contact edge of the board was then trimmed so that the elastomer was 1.3 cm wide.

EXAMPLE 3

A circuit board resembling board 12 of FIG. 2A was constructed as follows. A 1.14 mm slot was milled out of the contact edge of a 1.57 mm thick glass epoxy layer, leaving 0.22 mm thick board edge portions.

I claim:

1. A printed circuit board comprising:
   a printed circuit board capable of resilient deformation and having first and second outer major surfaces and a contact edge; and
   a plurality of electrically conductive traces provided on at least one of the major surfaces leading to a plurality of electrically conductive contact pads at the contact edge of the board;
   wherein the first and second major surfaces define a gap therebetween at the contact edge, wherein the gap permits resilient deformation of the board so that a force is created upon deformation which will bias the major surfaces toward their undeformed position.

2. The board of claim 1, further including a second plurality of contact pads on the other major surface leading to a second plurality of electrically conductive contact pads at the contact edge, and wherein the force created upon deformation biases the two pluralities of contact pads away from each other.

3. The board of claim 1, further including a pin guide assembly, wherein the contact edge is disposed within the assembly, and wherein the assembly is configured to guide a plurality of conductive pins into electrical contact with the plurality of contact pads.

4. The board of claim 1, further including a biasing member provided within the gap.

5. The board of claim 4, wherein the biasing member is an elastomer.

6. The board of claim 1, wherein at least one of the contact pads on one of the major surfaces is separated from an adjacent contact pad in the same surface by a slot in the board perpendicular to the contact edge.

7. The board of claim 6, wherein each slot ends prior to the contact edge of the board.

8. The board of claim 2, further including a pin guide assembly, wherein the two pluralities of contact pads on the two major surfaces of the board are disposed within the assembly, and wherein the assembly is configured to guide the two pluralities of electrically conductive pins into electrical contact with the two pluralities of contact pads.

9. The board of claim 2, further including an elastomeric biasing member provided within the gap.

10. The board of claim 3, further including an elastomeric biasing member provided within the gap.

11. The board of claim 3, wherein the assembly is detachably secured to the board.

12. The board of claim 5, wherein the elastomer is an adhesive.

* * * * *

UNITED STATES PATENT AND TRADEMARK OFFICE
CERTIFICATE OF CORRECTION

PATENT NO. : 5,345,364

DATED : September 6, 1994

INVENTOR(S) : Rolf W. Biernath

It is certified that error appears in the above-indentified patent and that said Letters Patent is hereby corrected as shown below:

Column 5, line 7, "majors" should read --major--.

Column 5, line 51, "pad," should read --pad.--.

Column 7, line 23, "contact pads" should read --conductive traces--.

Signed and Sealed this

Eighteenth Day of April, 1995

Attest:

BRUCE LEHMAN

Attesting Officer

*Commissioner of Patents and Trademarks*